US008865810B2

(12) United States Patent
Hoshi et al.

(10) Patent No.: US 8,865,810 B2
(45) Date of Patent: Oct. 21, 2014

(54) FORMED ARTICLE, METHOD FOR PRODUCING SAME, ELECTRONIC DEVICE MEMBER, AND ELECTRONIC DEVICE

(75) Inventors: Shinichi Hoshi, Kawagoe (JP); Takeshi Kondo, Tokyo (JP); Kazue Uemura, Tokyo (JP); Yuta Suzuki, Tokyo (JP)

(73) Assignee: Lintec Corporation, Tokyo (JP)

( * ) Notice: Subject to any disclaimer, the term of this patent is extended or adjusted under 35 U.S.C. 154(b) by 69 days.

(21) Appl. No.: 13/256,143

(22) PCT Filed: Mar. 24, 2010

(86) PCT No.: PCT/JP2010/055064
§ 371 (c)(1),
(2), (4) Date: Oct. 31, 2011

(87) PCT Pub. No.: WO2010/110304
PCT Pub. Date: Sep. 30, 2010

(65) Prior Publication Data
US 2012/0041116 A1 Feb. 16, 2012

(30) Foreign Application Priority Data

Mar. 26, 2009 (JP) ................................ 2009-076028

(51) Int. Cl.
C08K 5/54 (2006.01)
C23C 14/48 (2006.01)
C23C 14/56 (2006.01)
C23C 14/20 (2006.01)

(52) U.S. Cl.
CPC ............... *C23C 14/48* (2013.01); *C23C 14/562* (2013.01); *C23C 14/20* (2013.01)
USPC ...................................... 524/261; 250/492.3

(58) Field of Classification Search
USPC ...................................... 524/261; 250/492.3
See application file for complete search history.

(56) References Cited

U.S. PATENT DOCUMENTS

| | | | |
|---|---|---|---|
| 5,143,747 | A | 9/1992 | Matossian et al. |
| 5,458,753 | A | 10/1995 | Sato et al. |
| 5,907,382 | A | 5/1999 | Kajiura et al. |
| 6,352,931 | B1 | 3/2002 | Seta et al. |
| 6,416,817 | B1 | 7/2002 | Rangwalla et al. |
| 2002/0034885 | A1 | 3/2002 | Shindo |
| 2002/0059899 | A1 | 5/2002 | Seta et al. |
| 2002/0063830 | A1 | 5/2002 | Callegari et al. |
| 2002/0102843 | A1 | 8/2002 | Seta et al. |
| 2003/0224611 | A1 | 12/2003 | Seta et al. |
| 2003/0228475 | A1 | 12/2003 | Komada |
| 2004/0046497 | A1 | 3/2004 | Schaepkens et al. |
| 2004/0146660 | A1 | 7/2004 | Goodwin et al. |
| 2004/0265554 | A1 | 12/2004 | Miyadera et al. |
| 2005/0017633 | A1 | 1/2005 | Miyadera |
| 2005/0079380 | A1 | 4/2005 | Iwanaga |
| 2005/0082674 | A1 | 4/2005 | Seta et al. |
| 2005/0202259 | A1 | 9/2005 | Korevaar et al. |
| 2005/0287307 | A1 | 12/2005 | Singh et al. |
| 2006/0017162 | A1 | 1/2006 | Seta et al. |
| 2006/0232735 | A1 | 10/2006 | Hokazono et al. |
| 2007/0268089 | A1 | 11/2007 | McKenzie et al. |
| 2008/0018230 | A1 | 1/2008 | Yamada et al. |
| 2008/0096014 | A1 | 4/2008 | Griesser et al. |
| 2009/0021150 | A1 | 1/2009 | Kim et al. |
| 2009/0022907 | A1 | 1/2009 | Kim et al. |
| 2009/0110892 | A1 | 4/2009 | Erlat et al. |
| 2009/0130463 | A1 | 5/2009 | Albaugh et al. |
| 2009/0139564 | A1 | 6/2009 | Miyaji et al. |
| 2009/0148633 | A1 | 6/2009 | Inagaki et al. |
| 2009/0214882 | A1 | 8/2009 | Sakakura |
| 2010/0003482 | A1 | 1/2010 | Fukuda |
| 2010/0003483 | A1 | 1/2010 | Fukuda |
| 2011/0185948 | A1 | 8/2011 | Uemura et al. |
| 2011/0189450 | A1 | 8/2011 | Hoshi et al. |
| 2011/0274933 | A1 | 11/2011 | Hoshi et al. |
| 2012/0064321 | A1 | 3/2012 | Suzuki et al. |
| 2012/0101221 | A1 | 4/2012 | Hoshi et al. |
| 2012/0108761 | A1 | 5/2012 | Hoshi et al. |
| 2012/0295120 | A1 | 11/2012 | Nagamoto et al. |

FOREIGN PATENT DOCUMENTS

| | | |
|---|---|---|
| EP | 0 285 870 A2 | 10/1988 |
| EP | 2 615 144 A1 | 7/2013 |
| JP | 05-185568 | 7/1993 |
| JP | 6-64105 A | 3/1994 |
| JP | 6-187833 A | 7/1994 |
| JP | 8-45452 A | 2/1996 |

(Continued)

OTHER PUBLICATIONS

JP 2008 174792 machine translation (2008).*
International search report (PCT/JP2009/064457) (2009).*
Non-Final Office Action dated Apr. 16, 2013, issued in U.S. Appl. No. 13/055,274.
International Search Report for PCT/JP/2010/055064, dated May 11, 2010.
International Search Report for PCT/JP2009/064457, dated Dec. 1, 2009.
International Search Report for PCT/JP2011/057608, mailed on Apr. 26, 2011.

(Continued)

*Primary Examiner* — Kuo-Liang Peng
(74) *Attorney, Agent, or Firm* — Birch, Stewart, Kolasch & Birch, LLP

(57) ABSTRACT

Disclosed is a formed article comprising an ion-implanted layer obtained by implanting ions of a silicon compound into a polymer layer. Also disclosed are: a method of producing the formed article, the method comprising implanting ions of a silicon compound into a surface of a polymer layer of a formed body that includes the polymer layer in its surface; an electronic device member comprising the formed article; an electronic device comprising the electronic device member. Consequently, the present invention provides: a formed article which has excellent gas barrier capability, bendability and surface flatness; a method of producing the formed article, an electronic device member comprising the formed article; an electronic device comprising the electronic device member.

2 Claims, 2 Drawing Sheets

(56) References Cited

FOREIGN PATENT DOCUMENTS

| | | | |
|---|---|---|---|
| JP | 8-57560 A | 3/1996 |
| JP | 8-174748 A | 7/1996 |
| JP | 8-302043 A | 11/1996 |
| JP | 9-10687 A | 1/1997 |
| JP | 9-26755 A | 1/1997 |
| JP | 09-124807 | 5/1997 |
| JP | 10-244613 A | 9/1998 |
| JP | 10-249990 A | 9/1998 |
| JP | 10-305542 A | 11/1998 |
| JP | 2000-246830 A | 9/2000 |
| JP | 2000-254996 A | 9/2000 |
| JP | 2000-260870 A | 9/2000 |
| JP | 2000-338901 A | 12/2000 |
| JP | 2001-119051 A | 4/2001 |
| JP | 2001-207259 A | 7/2001 |
| JP | 2002-18246 A | 1/2002 |
| JP | 2002-105676 A | 4/2002 |
| JP | 2003-8179 A | 1/2003 |
| JP | 2003-154596 A | 5/2003 |
| JP | 2003-525995 A | 9/2003 |
| JP | 2003-347570 A | 12/2003 |
| JP | 2004-119138 A | 4/2004 |
| JP | 2004-527642 A | 9/2004 |
| JP | 2004-530790 A | 10/2004 |
| JP | 2004-322489 A | 11/2004 |
| JP | 2004-352966 A | 12/2004 |
| JP | 2005-88431 A | 4/2005 |
| JP | 2005-104025 A | 4/2005 |
| JP | 2005-119155 A | 5/2005 |
| JP | 2005-119160 A | 5/2005 |
| JP | 2005-169994 A | 6/2005 |
| JP | 2005-231039 A | 9/2005 |
| JP | 2005-240061 A | 9/2005 |
| JP | 2005-537963 A | 12/2005 |
| JP | 2006-35737 A | 2/2006 |
| JP | 2006-52376 A | 2/2006 |
| JP | 2006-70238 A | 3/2006 |
| JP | 2006-123306 A | 5/2006 |
| JP | 2006-123307 A | 5/2006 |
| JP | 2006-264118 A | 10/2006 |
| JP | 2007-022075 A | 2/2007 |
| JP | 2007-042616 A | 2/2007 |
| JP | 2007-065644 A | 3/2007 |
| JP | 2007/044181 A2 | 4/2007 |
| JP | 2007-237588 A | 9/2007 |
| JP | 2007-528447 A | 10/2007 |
| JP | 2007-283726 A | 11/2007 |
| JP | 2008-015500 A | 1/2008 |
| JP | 2008-504687 A | 2/2008 |
| JP | 2008-49601 A | 3/2008 |
| JP | 2008-62498 A | 3/2008 |
| JP | 2008-174792 A | 7/2008 |
| JP | 2008/096617 A1 | 8/2008 |
| JP | 2008-204683 A | 9/2008 |
| JP | 2008-235165 A | 10/2008 |
| JP | 2008-246893 A | 10/2008 |
| JP | 2008-270115 A | 11/2008 |
| JP | 2009-110897 A | 5/2009 |
| JP | 2009-199812 A | 9/2009 |
| JP | 2009-252574 A | 10/2009 |
| JP | 2009-287006 A | 12/2009 |
| JP | 2011-718 A | 1/2011 |
| WO | WO 2006/090602 A1 | 8/2006 |
| WO | WO 2007/040039 A1 | 4/2007 |
| WO | WO 2010/002182 A2 | 1/2010 |
| WO | WO 2010/021326 A1 | 2/2010 |
| WO | WO 2010/024378 A1 | 3/2010 |
| WO | WO 2010/067857 A1 | 6/2010 |
| WO | WO 2010/107018 A1 | 9/2010 |
| WO | WO 2010/134609 A1 | 11/2010 |
| WO | WO 2010/134611 A1 | 11/2010 |

OTHER PUBLICATIONS

International Search Report for PCT/JP2011/057610, mailed on Jul. 5, 2011.
International Search Report for PCT/JP2011/071203, mailed on Nov. 8, 2011.
Extended European Search Report for Application No. 11765502.7 dated Aug. 29, 2013.
International Search Report for International Application No. PCT/JP2009/070728 dated Feb. 9, 2010.
International Search Report for International Application No. PCT/JP2010/052058 dated Jun. 1, 2010.
International Search Report for International Application No. PCT/JP2010/058668 dated Aug. 10, 2010.
International Search Report for International Application No. PCT/JP2011/051507 dated May 10, 2011 (with English translation).
International Search Report for International Application No. PCT/JP2011/071208 dated Nov. 8, 2011.
International Search Report for International Application No. PCT/JP2011/071353 dated Nov. 8, 2011.
Kobayashi et al., "Surface modification of silicone sheets and tubes using plasma-based ion implantation," Surface & Coatings Technology, vol. 201, 2007, pp. 8039-8042.
Nakagawara et al., "Moisture-resistant ZnO transparent conductive films with Ga heavy doping", Applied Physics Letters, vol. 89, 2006, pp. 091904-1-091904-3.
Schauer et al., "Luminescence as a tool for crosslinking determination in plasma polysilylenes prepared from organosilanes", Synthetic Metals, vol. 109, 2000, pp. 321-325.
United States Advisory Action for U.S. Appl. No. 13/055,274 dated Apr. 15, 2014.
United States Advisory Action for U.S. Appl. No. 13/128,348 dated Feb. 10, 2014.
United States Advisory Action for U.S. Appl. No. 13/144,856 dated Mar. 3, 2014.
United States Notice of Allowance for U.S. Appl. No. 13/826,954 dated Feb. 28, 2014.
United States Office Action for U.S. Appl. No. 13/823,688 dated Feb. 25, 2014.
United States Office Action for copending U.S. Appl. No. 13/055,274 dated Nov. 7, 2013.
United States Office Action for copending U.S. Appl. No. 13/128,348 dated Feb. 14, 2013.
United States Office Action for copending U.S. Appl. No. 13/128,348 dated Sep. 13, 2013.
United States Office Action for copending U.S. Appl. No. 13/144,856 dated Mar. 15, 2013.
United States Office Action for copending U.S. Appl. No. 13/144,856 dated Oct. 18, 2013.
United States Office Action for copending U.S. Appl. No. 13/321,687 dated Jan. 15, 2014.
United States Office Action for copending U.S. Appl. No. 13/321,687 dated Oct. 8, 2013.
United States Office Action for copending U.S. Appl. No. 13/823,688 dated Nov. 8, 2013.
United States Office Action for copending U.S. Appl. No. 13/826,954 dated Nov. 7, 2013.
Extended European Search Report issued Feb. 17, 2014, in European Patent Application No. 11826800.2.
Extended European Search Report issued Mar. 27, 2014, in European Patent Application No. 11818032.2.
CAS Registry No. 151772 74 6, SciFinder, American Chemical Society (ACS) 2014.
United States Final Office Action for copending U.S. Appl. No. 13/321,687 dated Aug. 1, 2014.
United States Office Action for copending U.S. Appl. No. 13/055,274 dated Aug. 8, 2014.

\* cited by examiner (a)

(b)

FORMED ARTICLE, METHOD FOR PRODUCING SAME, ELECTRONIC DEVICE MEMBER, AND ELECTRONIC DEVICE

TECHNICAL FIELD

The invention relates to a formed article that exhibits an excellent gas barrier capability, bendability, and surface flatness, a method of producing the same, an electronic device member that includes the formed article, and an electronic device that includes the electronic device member.

BACKGROUND ART

A polymer formed article such as a plastic film is inexpensive and exhibits excellent workability. Therefore, such a polymer formed article is provided with a desired function, and used in various fields.

For example, a gas barrier plastic film that prevents permeation of water vapor and oxygen is used as a food/drug packaging film in order to suppress oxidation and denaturation of proteins, oils and fats, and the like to keep the taste and freshness.

In recent years, use of a transparent plastic film as a substrate instead of a glass plate has been proposed for displays (e.g., liquid crystal display and electroluminescence (EL) display) in order to implement a reduction in thickness, a reduction in weight, an increase in flexibility, and the like. However, since a plastic film tends to allow water vapor, oxygen, and the like to pass through as compared with a glass plate, the elements inside of the display may deteriorate.

In order to solve this problem, Patent Document 1 discloses a flexible display substrate in which a transparent gas barrier layer formed of a metal oxide is stacked on a transparent plastic film.

However, since the transparent gas barrier layer formed of a metal oxide is stacked on the surface of the transparent plastic film by vapor deposition, ion plating, sputtering, or the like, cracks may occur in the gas barrier layer when the substrate is rounded or folded, so that the gas barrier capability may deteriorate. The gas barrier film disclosed in Patent Document 1 also has a problem in that a pinhole is easily formed in an additional layer formed on the gas barrier layer due to insufficient surface flatness. Therefore, the gas barrier film cannot be reliably used for an electronic device member.

Patent Document 2 discloses a gas barrier laminate that includes a plastic film, and a resin layer that contains a polyorganosilsesquioxane as the main component and is stacked on at least one side of the plastic film.

However, since it is necessary to further stack an inorganic compound layer in order to obtain a gas (e.g., oxygen and water vapor) barrier capability, the process becomes complicated, and the production cost increases. Moreover, toxic gas may be used.

RELATED-ART DOCUMENT

Patent Document

Patent Document 1: JP-A-2000-338901
Patent Document 2: JP-A-2006-123307

SUMMARY OF THE INVENTION

Problems to be Solved by the Invention

The invention was conceived in view of the above situation. An object of the invention is to provide a formed article that exhibits an excellent gas barrier capability, excellent bendability, and excellent surface flatness, a method of producing the same, an electronic device member that includes the formed article, and an electronic device that includes the electronic device member.

Means for Solving the Problems

The inventors of the invention conducted extensive studies to achieve the above object. As a result, the inventors found that the target formed article can be conveniently and efficiently produced by implanting ions of a silicon compound into a surface of a polyorganosiloxane compound-containing layer of a formed body that includes the polyorganosiloxane compound-containing layer in its surface. This finding has led to the completion of the invention.

A first aspect of the invention provides the following formed article (see (1) to (4)).
(1) A formed article including an ion-implanted layer obtained by implanting ions of a silicon compound into a polymer layer.
(2) The formed article according to (1), wherein the ion-implanted layer is obtained by implanting ions of the silicon compound into the polymer layer by plasma ion implantation method.
(3) The formed article according to (1) or (2), wherein the polymer layer is a polyorganosiloxane compound-containing layer.
(4) The formed article according to any one of (1) to (3), the formed article having a water vapor transmission rate at a temperature of 40° C. and a relative humidity of 90% of less than 1 g m$^2$day.

A second aspect of the invention provides the following method of producing a formed article (see (5) to (8)).
(5) A method of producing the formed article according to (1), the method including implanting ions of a silicon compound into a surface of a polymer layer of a formed body that includes the polymer layer in its surface.
(6) A method of producing the formed article according to (2), the method including implanting ions of a silicon compound into a surface of a polymer layer of a formed body that includes the polymer layer in its surface by plasma ion implantation.
(7) The method according to (5) or (6), the method including implanting ions of a silicon compound into a polymer layer of a long formed body that includes the polymer layer in its surface while transferring the long formed body in a given direction.
(8) The method according to any one of (5) to (2), wherein the polymer layer is a polyorganosiloxane compound-containing layer.

A third aspect of the invention provides the following electronic device member (see (9)).
(9) An electronic device member including the formed article according to any one of (1) to (4).

A fourth aspect of the invention provides the following electronic device (see (10)).
(10) An electronic device including the electronic device member according to (9).

Effects of the Invention

The above formed article exhibits an excellent gas barrier capability, excellent bendability, and excellent surface flatness. Therefore, the formed article may suitably be used as an electronic device member for displays, solar batteries, and the like.

The above method of producing a formed article can safely and conveniently produce the above formed article that exhibits an excellent gas barrier capability, excellent bendability, and excellent surface flatness. Moreover, an increase in area can be easily achieved at low cost as compared with a method that deposits an inorganic film.

Since the above electronic device member exhibits an excellent gas barrier capability, excellent bendability, and excellent surface flatness, the electronic device member may suitably be used for electronic devices such as displays and solar batteries.

DESCRIPTION OF EXEMPLARY EMBODIMENTS

Figure 1:
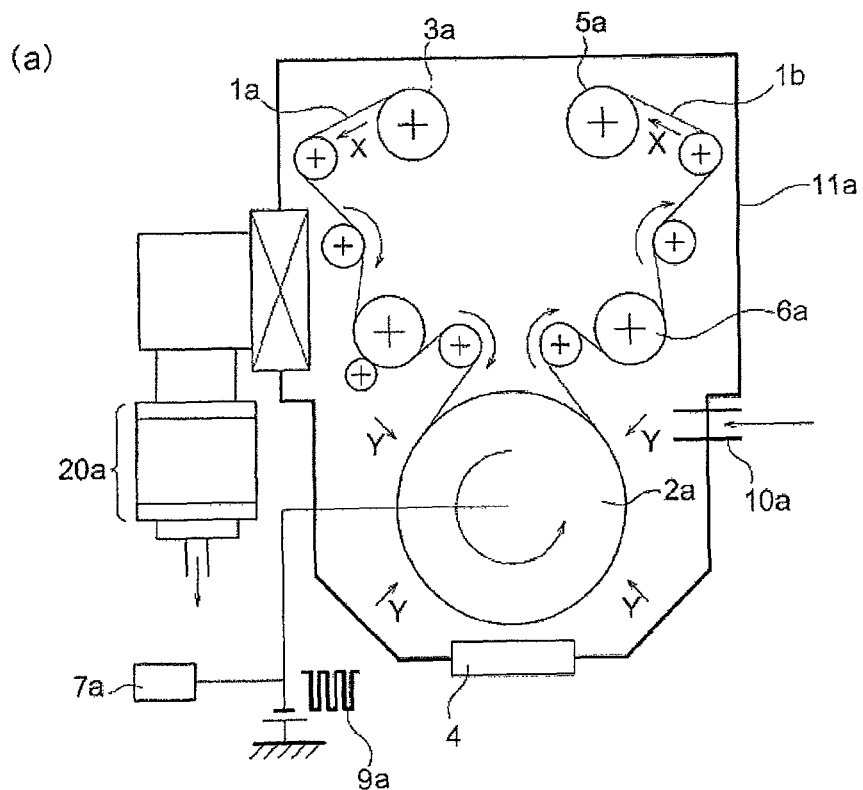
FIG. 1 is a view showing a schematic configuration of a plasma ion implantation apparatus.
Figure 1:
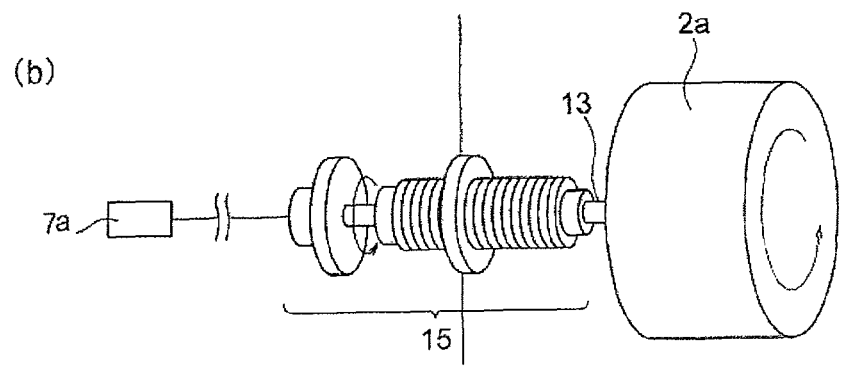

A formed article, a method of producing a formed article, an electronic device member, and an electronic device according to embodiments of the invention are described in detail in below.

1) Formed Article

A formed article according to one embodiment of the invention includes a layer (hereinafter referred to as "ion-implanted layer") obtained by implanting ions of a silicon compound into a polymer layer.

The ion-implanted layer included in the formed article according to one embodiment of the invention is not particularly limited insofar as the ion-implanted layer is obtained by implanting ions of a silicon compound into a polymer layer.

Examples of the polymer that forms the polymer layer include, but are not limited to, polyimides, polyamides, polyamideimides, polyphenylene ethers, polyether ketones, polyether ether ketones, polyolefins, polyesters, polycarbonates, polysulfones, polyether sulfones, polyphenylene sulfides, polyallylates, acrylic resins, cycloolefin polymers, aromatic polymers, polyorganosiloxane compounds, and the like.

These polymers may be used either individually or in combination.

Among these, polyorganosiloxane compounds and polyesters such as polyethylene terephthalate, polybutylene terephthalate, and polyethylene naphthalate are preferable. The polymer layer is particularly preferably a polyorganosiloxane compound-containing layer in order to obtain a formed article that exhibits an excellent gas barrier capability.

The polyorganosiloxane compound is not particularly limited. The polyorganosiloxane compound may have a linear, ladder-like, or polyhedral structure.

Examples of the linear main chain structure of the polyorganosiloxane compound include a structure shown by the following formula (a). Examples of the ladder-like main chain structure of the polyorganosiloxane compound include a structure shown by the following formula (b). Examples of the polyhedral main chain structure of the polyorganosiloxane compound include a structure shown by the following formula (c).

[Chemical Formula 1]

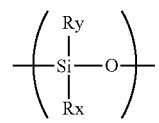

(a)

[Chemical Formula 2]

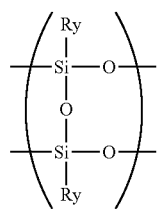

(b)

[Chemical Formula 3]

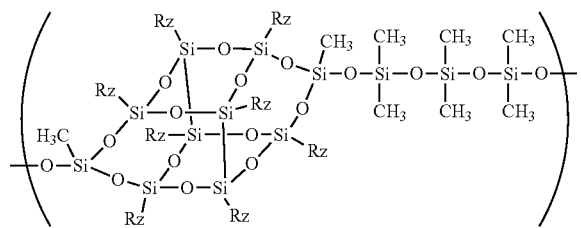

(c)

wherein Rx, Ry, and Rz individually represent a hydrogen atom, a non-hydrolyzable group such as a substituted or unsubstituted alkyl group, a substituted or unsubstituted alkenyl group, or a substituted or unsubstituted aryl group, provided that a case where both Rx in the formula (a) or both Ry in the formula (b) represent a hydrogen atom is excluded.

Examples of the substituted or unsubstituted alkyl group include alkyl groups having 1 to 10 carbon atoms (e.g., methyl group, ethyl group, n-propyl group, isopropyl group, n-butyl group, isobutyl group, sec-butyl group, t-butyl group, n-pentyl group, isopentyl group, neopentyl group, n-hexyl group, n-heptyl group, and n-octyl group).

Examples of the alkenyl group include alkenyl groups having 2 to 10 carbon atoms (e.g., vinyl group, 1-propenyl group, 2-propenyl group, 1-butenyl group, 2-butenyl group, and 3-butenyl group).

Examples of a substituent for the alkyl group and the alkenyl group include halogen atoms such as a fluorine atom, a chlorine atom, a bromine atom, and an iodine atom; a hydroxyl group; a thiol group; an epoxy group; a glycidoxy group; a (meth)acryloyloxy group; substituted or unsubstituted phenyl groups such as a phenyl group, a 4-methylphenyl group, and a 4-chlorophenyl group; and the like.

Examples of the aryl group include aryl groups having 6 to 10 carbon atoms (e.g., phenyl group, 1-naphthyl group, and 2-naphthyl group).

Examples of a substituent for the aryl group include halogen atoms such as a fluorine atom, a chlorine atom, a bromine atom, and an iodine atom; alkyl groups having 1 to 6 carbon atoms, such as a methyl group and an ethyl group; alkoxy groups having 1 to 6 carbon atoms, such as a methoxy group and an ethoxy group; a nitro group; a cyano group; a hydroxyl group; a thiol group; an epoxy group; a glycidoxy group; a (meth)acryloyloxy group; substituted or unsubstituted aryl groups such as a phenyl group, a 4-methylphenyl group, and a 4-chlorophenyl group; and the like.

Among these, a hydrogen atom, an alkyl group having 1 to 6 carbon atoms, or a phenyl group is preferable as Rx, Ry, and Rz. An alkyl group having 1 to 6 carbon atoms is particularly preferable as Rx, Ry, and Rz.

Note that a plurality of Rx in the formula (a), a plurality of Ry in the formula (b), and a plurality of Rz in the formula (c) may respectively be either the same or different.

The polyorganosiloxane compound is preferably a linear compound shown by the formula (a) or a ladder-like compound shown by the formula (b), and particularly preferably a polydimethylsiloxane shown by the formula (a) in which both Rx represent a methyl group, from the viewpoint of availability and a capability to form an ion-implanted layer that exhibits an excellent gas barrier capability.

The polyorganosiloxane compound may be produced by a known method that polycondenses a silane compound including a hydrolyzable functional group.

The silane compound may be appropriately selected depending on the structure of the target polyorganosiloxane compound. Specific examples of a preferable silane compound include bifunctional silane compounds such as dimethyldimethoxysilane, dimethyldiethoxysilane, diethyldimethoxysilane, and diethyldiethoxysilane; trifunctional silane compounds such as methyltrimethoxysilane, methyltriethoxysilane, ethyltrimethoxysilane, ethyltriethoxysilane, n-propyltrimethoxysilane, n-butyltriethoxysilane, phenyltrimethoxysilane, phenyltriethoxysilane, and phenyldiethoxymethoxysilane; tetrafunctional silane compounds such as tetramethoxysilane, tetraethoxysilane, tetra-n-propoxysilane, tetraisopropoxysilane, tetra-n-butoxysilane, tetra-t-butoxysilane, tetra-s-butoxysilane, methoxytriethoxysilane, dimethoxydiethoxysilane, and trimethoxyethoxysilane; and the like.

A product commercially available as a release agent, an adhesive, a sealant, a paint, or the like as is may be used as the polyorganosiloxane compound.

The content of the polyorganosiloxane compound in the polyorganosiloxane compound-containing layer is preferably 50 wt % or more, and more preferably 70 wt % or more, in order to obtain an ion-implanted layer that exhibits an excellent gas barrier capability.

The polymer layer may include a component other than the polymer compound (main component) insofar as the object of the invention is not impaired. Examples of a component other than the polymer compound include a curing agent, an aging preventive, a light stabilizer, a flame retardant, and the like.

The polymer layer may be formed by an arbitrary method.

For example, a polyorganosiloxane compound-containing layer may be formed by applying a solution that includes at least one polyorganosiloxane compound, an optional component, and a solvent to an appropriate base, drying the resulting film, and optionally heating the dried film. The base may be a film formed of a material that forms an additional layer described later.

The thickness of the resulting polyorganosiloxane compound-containing layer is not particularly limited, but is normally 30 nm to 100 μm.

A commercially available polymer film formed of the above polymer may be used as the polymer layer.

The ion-implanted layer is obtained by implanting ions of a silicon compound (hereinafter may be referred to as "ions") into the polymer layer.

Examples of the silicon compound include silane ($SiH_4$) and organosilicon compounds.

Examples of the organosilicon compounds include tetraalkoxysilanes such as tetramethoxysilane, tetraethoxysilane, tetra-n-propoxysilane, tetraisopropoxysilane, tetra-n-butoxysilane and tetra-t-butoxysilane; substituted or unsubstituted alkylalkoxysilanes such as dimethyldimethoxysilane, dimethyldiethoxysilane, diethyldimethoxysilane, methyltriethoxysilane, ethyltrimethoxysilane, and (3,3,3-trifluoropropyl)trimethoxysilane; arylalkoxysilanes such as diphenyldimethoxysilane and phenyltriethoxysilane; disiloxanes such as hexamethyldisiloxane (HMDSO); aminosilanes such as bis(dimethylamino)dimethylsilane, bis(dimethylamino)methylvinylsilane, bis(ethylamino)dimethylsilane, diethylaminotrimethylsilane, dimethylaminodimethylsilane, tetrakisdimethylaminosilane, and tris(dimethylamino)silane; silazanes such as hexamethyldisilazane, hexamethylcyclotrisilazane, heptamethyldisilazane, nonamethyltrisilazane, octamethylcyclotetrasilazane, and tetramethyldisilazane; cyanatosilanes such as tetraisocyanatosilane; halogenosilanes such as triethoxyfluorosilane; alkenylsilanes such as diallyldimethylsilane and allyltrimethylsilane; substituted or unsubstituted alkylsilanes such as di-t-butylsilane, 1,3-disilabutane, bis(trimethylsilyl)methane, trimethylsilane, tetramethylsiane, tris(trimethylsilyl)methane, tris(trimethylsilyl)silane, and benzyltrimethylsilane; silylalkynes such as bis(trimethylsilyl)acetylene, trimethylsilylacetylene, and 1-(trimethylsilyl)-1-propyne; silylalkenes such as 1,4-bistrimethylsily1-1,3butadiene and cyclopentadienyltrimethylsilane; arylalkylsilanes such as phenyldimethylsilane and phenyltrimethylsilane; alkynylalkylsilanes such as propargyltrimethylsilane; alkenylalkylsilanes such as vinyltrimethylsilane; disilanes such as hexamethyldisilane; siloxanes such as octamethylcyclotetrasiloxane, tetramethylcyclotetrasiloxane, and hexamethylcyclotetrasiloxane; N,O-bis(trimethylsilyl)acetamide; bis(trimethylsilyl)carbodiimide; and the like. These gases may be used either individually or in combination.

Among these, disiloxanes, alkylsilanes, tetraalkoxysilanes, and silazanes are preferable since the target formed article can be more easily obtained.

The dose may be appropriately determined depending on the usage of the formed article (e.g., gas barrier capability and transparency), and the like.

Ions may be implanted into the polymer layer by an arbitrary method. For example, a polyorganosiloxane compound-containing layer may be formed on a base, and then ions of a silicon compound may be implanted into the polyorganosiloxane compound-containing layer.

Ions may be implanted by applying ions (ion beams) accelerated by an electric field, implanting ions present in plasma, or the like. It is preferable to implant ions present in plasma (hereinafter referred to as "plasma ion implantation method") since a gas-barrier formed article can be easily obtained.

Plasma ion implantation may be implemented by generating plasma in an atmosphere containing a silicon compound gas, and implanting ions present in the plasma into the surface of the polymer layer by applying a negative high-voltage pulse to the polymer layer, for example.

The thickness of the ion implantation area can be controlled by adjusting the implantation conditions, and may be appropriately determined depending on the application of the resulting formed article. The thickness of the ion implantation area is normally 0.1 to 1000 nm.

The shape of the formed article according to one embodiment of the invention is not particularly limited. For example, the formed article may be in the shape of a film, a sheet, a rectangular parallelepiped, a polygonal prism, a tube, or the like. When using the formed article as an electronic device member (described later), the formed article is preferably in the shape of a film or a sheet. The thickness of the film may be appropriately determined depending on the desired application of the electronic device.

The formed article according to one embodiment of the invention may include only the polymer layer including an ion-implanted layer, or may also include an additional layer other than the polymer layer. The additional layer may be a single layer, or may include a plurality of identical or different layers.

Examples of the material that forms the additional layer include the polymers mentioned above as the material used for the polymer layer into which ions are implanted. Among these, polyesters, polyamides, or cycloolefin polymers are preferable due to excellent transparency and versatility. It is more preferable to use polyesters or cycloolefin polymers.

Examples of the polyesters include polyethylene terephthalate, polybuthylene terephthalate, polyethylene naphthalate, polyallylate, and the like.

Examples of the polyamides include wholly aromatic polyamides, nylon 6, nylon 66, nylon copolymers, and the like.

Examples of the cycloolefin polymers include norbornene polymers, monocyclic olefin polymers, cyclic conjugated diene polymers, vinyl alicyclic hydrocarbon polymers, and hydrogenated products thereof. Specific examples of the cycloolefin polymers include Apel (ethylene-cycloolefin copolymer manufactured by Mitsui Chemicals Inc.), Arton (norbornene polymer manufactured by JSR Corporation), Zeonor (norbornene polymer manufactured by Zeon Corporation), and the like.

When the formed article according to one embodiment of the invention is a laminate that includes the additional layer, the ion-implanted layer may be situated at an arbitrary position, but preferably forms the surface layer of the formed article from the viewpoint of production efficiency and the like. When the ion-implanted layer forms the surface layer of the formed article, the ion-implanted layer may be formed on one side of the additional layer, or may be formed on each side of the additional layer.

The formed article according to one embodiment of the invention exhibits an excellent gas barrier capability, excellent bendability, and excellent surface flatness, and preferably has a film-like or sheet-like shape (hereinafter referred to as "film-like shape").

The formed article according to one embodiment of the invention exhibits an excellent gas barrier capability since the formed article has a significantly low gas (e.g., water vapor) transmission rate as compared with the case where ions are not implanted into the formed body. For example, the water vapor transmission rate of the formed article at a temperature of 40° C. and a relative humidity of 90% (i.e., the amount of water vapor that passes through the formed article in a humidity-controlled room at a temperature of 40° C. and a relative humidity of 90%) is preferably 1 g m$^2$day•or less, and more preferably 0.5 g m$^2$day•or less. The gas (e.g., water vapor) transmission rate of the formed article may be measured using a known gas transmission rate measuring apparatus.

The formed article according to one embodiment of the invention exhibits excellent bendability since the formed article does not deteriorate when the formed article is wound around a stainless steel rod and rotated in the circumferential direction ten times in a state in which the ion-implanted side is positioned on the outer side, for example.

The surface roughness Ra (nm) (measurement area: 1×1 μm and 25×25 μm) of the formed article according to one embodiment of the invention may be measured using an atomic force microscope (AFM). The surface roughness Ra of the formed article when the measurement area is 1×1 μm is preferably 0.35 nm or less, and more preferably 0.3 nm or less, and the surface roughness Ra of the formed article when the measurement area is 25×25 μm is preferably 6 nm or less.

2) Method of Producing Formed Article

A method of producing a formed article according to one embodiment of the invention includes implanting ions of a silicon compound into a surface of a polymer layer of a formed body that includes the polymer layer in its surface.

In the method of producing a formed article according to one embodiment of the invention, it is preferable to implant ions of a silicon compound into a polymer layer of a long formed body that includes the polymer layer in its surface while carrying the formed body in a given direction.

According to this configuration, ions can be implanted into a long formed body would around a feed-out roll while carrying the formed body in a given direction, which can then be wound around a wind-up roll, for example. Therefore, an ion-implanted formed article can be continuously produced.

The long formed body has a film-like shape. The formed body may include only the polymer layer, or may include an additional layer other than the polymer layer. Examples of the additional layer include the additional layers mentioned above.

The thickness of the formed body is preferably 1 to 500 μm, and more preferably 5 to 300 μm, from the viewpoint of operability of winding, unwinding and feeding.

In the method of producing a formed article according to one embodiment of the invention, ions may be implanted into the polymer layer by an arbitrary method. It is preferable to form an ion-implanted layer in the surface of the polymer layer by plasma ion implantation.

Plasma ion implantation method includes implanting ions present in plasma into the surface of the polymer layer by applying a negative high-voltage pulse to the formed body that is exposed to plasma and includes the polymer layer in its surface.

As the plasma ion implantation method, it is preferable to use (A) a method that implants ions present in plasma generated by utilizing an external electric field into the surface of the polymer layer, or (B) a method that implants ions present in plasma generated due to an electric field produced by applying a negative high-voltage pulse to the polymer layer into the surface of the polymer layer.

When using the method (A), it is preferable to set the ion implantation pressure (plasma ion implantation pressure) to 0.01 to 1 Pa. If the plasma ion implantation pressure is within the above range, a uniform ion-implanted layer can be formed conveniently and efficiently. This makes it possible to efficiently form an ion-implanted layer that exhibits transparency and a gas barrier capability.

The method (B) does not require increasing the degree of decompression, allows an easy operation, and significantly reduces the processing time. Moreover, the entire polymer layer can be uniformly processed, and ions present in plasma can be continuously implanted into the surface of the polymer layer with high energy when applying a negative high-voltage pulse. The method (B) also has an advantage in that an excellent ion-implanted layer can be uniformly formed in the surface of the polymer layer by merely applying a negative high-voltage pulse to the polymer layer without requiring a special means such as a high-frequency power supply (e.g., radio frequency (RF) power supply or microwave power supply).

When using the method (A) or (B), the pulse width when applying a negative high-voltage pulse (i.e., during ion implantation) is preferably 1 to 15 μs. If the pulse width is within the above range, a transparent and uniform ion-implanted layer can be formed more conveniently and efficiently.

The voltage applied when generating plasma is preferably −1 to −50 kV, more preferably −1 to −30 kV, and particularly preferably −5 to −20 kV. If the applied voltage is higher than −1 kV, the dose may be insufficient, so that the desired performance may not be obtained. If the applied voltage is lower than −50 kV, the formed article may be charged during ion implantation, or the formed article may be colored.

A plasma ion implantation apparatus is used when implanting ions present in the plasma into the surface of the polymer layer.

Specific examples of the plasma ion implantation apparatus include (a) an apparatus that causes the polymer layer (hereinafter may be referred to as "ion implantation target layer") to be evenly enclosed by plasma by superimposing high-frequency electric power on a feed-through that applies a negative high-voltage pulse to the ion implantation target layer so that ions present in plasma are attracted, implanted, collide, and are deposited (JP-A-2001-26887), (β) an apparatus that includes an antenna in a chamber, wherein high-frequency electric power is applied to generate plasma, positive and the negative pulses are alternately applied to the ion implantation target layer after plasma has reached an area around the ion implantation target layer, so that ions present in plasma are attracted and implanted by heating the ion implantation target layer by causing electrons present in plasma to be attracted and collide due to the positive pulse, and applying the negative pulse while controlling the temperature by controlling the pulse factor (JP-A-2001-156013), (γ) a plasma ion implantation apparatus that generates plasma using an external electric field (e.g., microwave high-frequency electric power supply), and causes ions present in plasma to be attracted and implanted by applying a high-voltage pulse, (δ) a plasma ion implantation apparatus that implants ions present in plasma generated due to an electric field produced by applying a high-voltage pulse without using an external electric field, and the like.

It is preferable to use the plasma ion implantation apparatus (γ) or (δ) since the plasma ion implantation apparatus (γ) or (δ) allows a convenient operation, significantly reduces the processing time, and can be continuously used.

A method using the plasma ion implantation apparatus (γ) or (δ) is described in detail below with reference to the drawings.

FIG. 1 is a view schematically showing a continuous plasma ion implantation apparatus that includes the plasma ion implantation apparatus (γ).

In FIG. 1(a), reference sign 1a indicates a long film-like formed body (hereinafter referred to as "film") that includes an ion implantation target polymer layer in its surface, reference sign 11a indicates a chamber, reference sign 20a indicates a turbo-molecular pump, reference sign 3a indicates a feed-out roll around which the film 1a is wound before ion implantation, reference sign 5a indicates a wind-up roll around which an ion-implanted film (formed article) 1b is wound, reference sign 2a indicates a high-voltage rotary can, reference sign 6a indicates a driving roll, reference sign 10a indicates a gas inlet, reference sign 7a indicates a high-voltage pulse power supply, and reference sign 4 indicates a plasma discharge electrode (external electric field). FIG. 1(b) is a perspective view showing the high-voltage rotary can 2a, wherein reference numeral 15 indicates a high-voltage application terminal (feed-through).

The long film 1a that includes a polymer layer in its surface is a film in which a polymer layer is formed on a base (additional layer).

In the continuous plasma ion implantation apparatus shown in FIG. 1, the film 1a is carried from the feed-out roll 3a in an arrow direction X inside the chamber 11a, passes through the high-voltage rotary can 2a, and is wound around the wind-up roll 5a. The film 1a may be wound and carried by an arbitrary method. In one embodiment, the film 1a is carried by rotating the high-voltage rotary can 2a at a constant speed. The high-voltage rotary can 2a is rotated by rotating a center shaft 13 of the high-voltage application terminal 15 using a motor.

The high-voltage application terminal 15, the driving rolls 6a that come in contact with the film 1a, and the like are formed of an insulator. For example, the high-voltage application terminal 15, the driving rolls 6a, and the like are formed by coating the surface of alumina with a resin (e.g., polytetrafluoroethylene). The high-voltage rotary can 2a is formed of a conductor (e.g., stainless steel).

The transfer speed of the film 1a may be appropriately set. The transfer speed of the film 1a is not particularly limited insofar as ions are implanted into the film 1a so that the desired implanted layer is formed when the film 1a is carried from the feed-out roll 3a and wound around the wind-up roll 5a. The film winding speed (line speed) is determined depending on the applied voltage, the size of the apparatus, and the like, but is normally 0.1 to 3 m min, and preferably 0.2 to 2.5 m/min.

The pressure inside the chamber 11a is reduced by discharging air from the chamber 11a using the turbo-molecular pump 20a connected to a rotary pump. The degree of decompression is normally $1 \times 10^{-4}$ to 1 Pa, and preferably $1 \times 10^{-3}$ to $1 \times 10^{-2}$ Pa.

An ion implantation gas (e.g., trimethylsilane gas) is then introduced into the chamber 11a through the gas inlet 10a so that the chamber 11a is filled with the ion implantation gas under reduced pressure.

Plasma is then generated using the plasma discharge electrode 4 (external electric field). The plasma may be generated by a known method using a high-frequency electric power supply (e.g., RF power supply or microwave power supply)

A negative high-voltage pulse 9a is applied from the high-voltage pulse power supply 7a connected to the high-voltage rotary can 2a through the high-voltage application terminal 15. When the negative high-voltage pulse is applied to the high-voltage rotary can 2a, ions present in the plasma are attracted, and implanted into the surface of the film around the high-voltage rotary can 2a (arrow Y in FIG. 1a)).

The pressure during ion implantation (i.e., the pressure of plasma gas inside the chamber 11a) is preferably 0.01 to 1 Pa. The pulse width during ion implantation is preferably 1 to 15 μs. The applied voltage when applying a negative high-voltage to the high-voltage rotary can 2a is preferably −1 to −50 kV.

Figure 2:
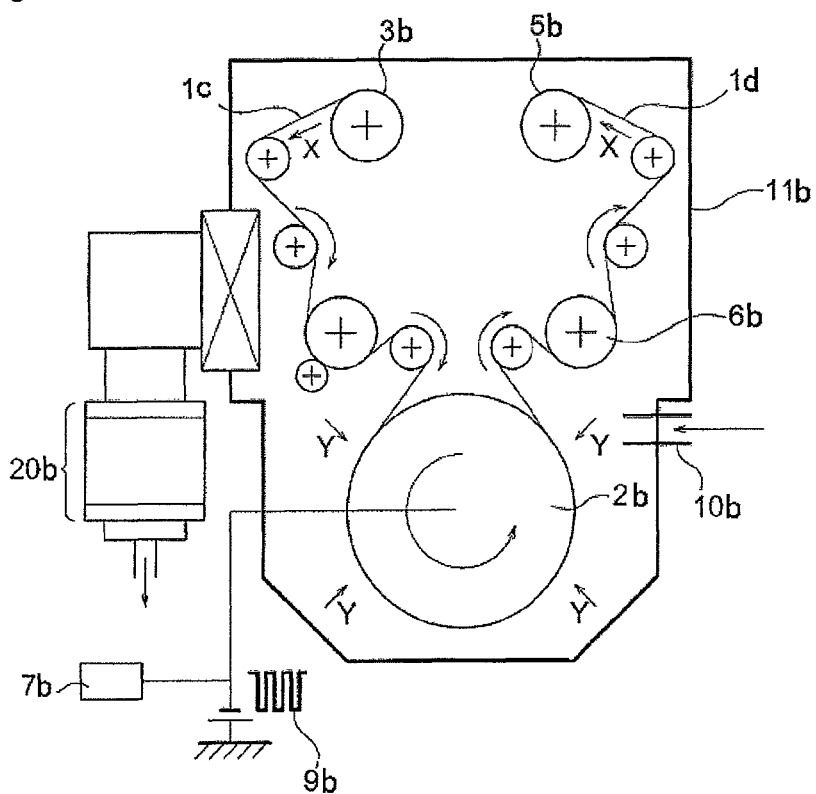
FIG. 2 is a view showing a schematic configuration of a plasma ion implantation apparatus.

A method of implanting ions into a polymer layer of a film that includes the polymer layer in its surface using a continuous plasma ion implantation apparatus shown in FIG. 2 is described below.

The apparatus shown in FIG. 2 includes the plasma ion implantation apparatus described in (δ). The plasma ion implantation apparatus generates plasma by applying an electric field due to a high-voltage pulse without using an external electric field (i.e., the plasma discharge electrode 4 shown in FIG. 1).

In the continuous plasma ion implantation apparatus shown in FIG. 2, a film 1c (film-shaped formed body) is carried in an arrow direction X shown in FIG. 2 by rotating a high-voltage rotary can 2b, and wound around a wind-up roll 5b. Note that reference sign 6b indicates a driving roll.

The continuous plasma ion implantation apparatus shown in FIG. 2 implants ions into the surface of the polymer layer as described below.

The film 1c is placed in a chamber 11b in the same manner as the plasma ion implantation apparatus shown in FIG. 1. The pressure inside the chamber 11b is reduced by discharging air from the chamber 11b using a turbo-molecular pump 20b connected to a rotary pump. An ion implantation gas is introduced into the chamber 11b through a gas inlet 10b so that the chamber 11b is filled with the ion implantation gas under reduced pressure.

The pressure during ion implantation (i.e., the pressure of plasma gas inside the chamber 11b) is 10 Pa or less, preferably 0.01 to 5 Pa, and more preferably 0.01 to 1 Pa.

A high-voltage pulse 9b is applied from a high-voltage pulse power supply 7b connected to the high-voltage rotary can 2b through a high-voltage application terminal while carrying the film 1c in the direction X shown in FIG. 2.

When a negative high-voltage pulse is applied to the high-voltage rotary can 2b, plasma is generated along the film 1c positioned around the high-voltage rotary can 2b, and ions of the ion implantation gas present in plasma are attracted, and implanted into the surface of the film 1c around the high-voltage rotary can 2b (arrow Y in FIG. 2). An ion-implanted layer is formed in the surface of the film 1c due to implantation of ions into the surface of the polymer layer of the film 1c.

The applied voltage and the pulse width employed when applying a negative high-voltage pulse to the high-voltage rotary can 2b, and the pressure employed during ion implantation are the same as those employed when using the continuous plasma ion implantation apparatus shown in FIG. 1.

In the plasma ion implantation apparatus shown in FIG. 2, since the high-voltage pulse power supply also serves as a plasma generation means, a special means such as a high-frequency electric power supply (e.g., RF power supply or microwave power supply) is unnecessary. An ion-implanted layer can be continuously formed by implanting ions present in plasma into the surface of the polymer layer by merely applying a negative high-voltage pulse. Therefore, a formed article in which an ion-implanted layer is formed in the surface of a film can be mass-produced.

3) Electronic Device Member and Electronic Device

An electronic device member according to one embodiment of the invention includes the formed article according to one embodiment of the invention. Therefore, since the electronic device member according to one embodiment of the invention exhibits an excellent gas barrier capability, a deterioration in the element (member) due to gas (e.g., water vapor) can be prevented. The electronic device member may suitably be used as a display member for liquid crystal displays, EL displays, and the like; a solar battery member such as a solar battery protective sheet (backsheet); and the like.

An electronic device according to one embodiment of the invention includes the electronic device member according to one embodiment of the invention. Specific examples of the electronic device include a liquid crystal display, an organic EL display, an inorganic EL display, electronic paper, a solar battery, and the like.

Since the electronic device according to one embodiment of the invention includes the electronic device member that includes the formed article according to one embodiment of the invention, the electronic device exhibits an excellent gas barrier capability and excellent bendability.

EXAMPLES

The invention is further described below by way of examples. Note that the invention is not limited to the following examples.

The following plasma ion implantation apparatus, water vapor transmission rate measuring device, water vapor transmission rate measurement conditions, surface flatness evaluation method, and bendability test method were used in the examples. An apparatus that implants ions using an external electric field was used as the plasma ion implantation apparatus.

Plasma ion implantation apparatus
RF power supply: "RF56000" manufactured by JEOL Ltd.
High-voltage pulse power supply: "PV-3-HSEV-0835" manufactured by Kurita Seisakusho Co., Ltd.
Water vapor transmission rate measuring device
Transmission rate tester: "L89-500" manufactured by LYSSY
Water vapor transmission rate measurement condition: Relative humidity and temperature: 90% and 40° C.
Surface Flatness Evaluation Method The surface roughness Ra (nm) (measurement area: 1×1 μm (1 μm square) and 25×25 μm (25 μm square)) was measured using an atomic force microscope (AFM) ("SPA300HV" manufactured by SII NanoTechnology Inc.).

Bendability Test

The formed article was wound around a stainless steel rod having a diameter of 3 mm so that the side of the ion-implanted layer (the polydimethylsiloxane layer in Comparative Example 1, and the silicon nitride film in Comparative Example 2) faced outside of the rod, and rotated ten times in the circumferential direction. The presence or absence of cracks was then determined using an optical microscope (manufactured by Keyence Corporation) (magnification: 2000). A case where cracks were not observed is indicated by "None", and a case where cracks were observed is indicated by "Occurred".

Example 1

A silicone release agent ("BY-24-561" manufactured by Shin-Etsu Chemical Co., Ltd.) containing a polydimethylsiloxane as the main component was applied to a polyethylene terephthalate film (PET film) ("PET38T-300" manufactured by Mitsubishi Plastics, Inc., thickness: 38 μm) (as a base). The silicone release agent was heated at 120° C. for 2 minutes to form a polymer layer (polydimethylsiloxane-containing layer) (thickness: 100 nm) on the PET film. A formed body was thus obtained. Hexamethyldisiloxane (HMDSO) gas (ion implantation gas (plasma-generating gas)) was implanted into the surface of the polydimethylsiloxane-containing layer using the plasma ion implantation apparatus shown in FIG. 1 to obtain a formed article 1.

The following plasma ion implantation conditions were used.
Duty ratio: 0.5%
Repetition frequency: 1000 Hz
Applied voltage: −10 kV
RF power supply: frequency: 13.56 MHz, applied electric power: 1000 W
Chamber internal pressure: 0.2 Pa
Pulse width: 5μs
Processing time (ion implantation time): 5 minutes
Gas flow rate: 40 can

Example 2

A formed article 2 was obtained in the same manner as in Example 1, except for using trimethylsilane as the plasma-generating gas instead of HMDSO.

Example 3

A formed article 3 was obtained in the same manner as in Example 1, except for using tetraethoxysilane as the plasma-generating gas instead of HMDSO.

Example 4

A formed article 4 was obtained in the same manner as in Example 1, except that the silicone release agent was not applied to the PET film. Specifically, HMDSO was directly implanted into the surface of the PET film to obtain the formed article 4.

Comparative Example 1

A formed article 5 was obtained in the same manner as in Example 1, except that ion implantation was not performed. Specifically, the polydimethylsiloxane-containing layer was formed on the PET film to obtain the formed article 5.

Comparative Example 2

A silicon nitride ($Si_3N_4$) film (thickness: 50 nm) was formed on a PET film by sputtering to obtain a formed article 6.

The formed articles 1 to 6 obtained in Examples 1 to 4 and Comparative Examples 1 and 2 were subjected to measurement of the water vapor transmission rate, the bendability test, and surface flatness evaluation. The results are shown in Table 1.

TABLE 1

| | Formed article | Water vapor transmission rate (g/m²/day) | Presence or absence of cracks after bendability test | Ra (nm) (1 × 1 μm) | Ra (nm) (25 × 25 μm) |
|---|---|---|---|---|---|
| Example 1 | 1 | 0.13 | None | 0.30 | 5.62 |
| Example 2 | 2 | 0.20 | None | 0.25 | 4.73 |
| Example 3 | 3 | 0.10 | None | 0.22 | 4.61 |
| Example 4 | 4 | 0.17 | None | 0.32 | 5.89 |
| Comparative Example 1 | 5 | 10.37 | None | 1.18 | 12.40 |
| Comparative Example 2 | 6 | 8.70 | Observed | 0.68 | 6.93 |

As shown in Table 1, the formed articles 1 to 4 obtained in Examples 1 to 4 had a low water vapor transmission rate as compared with the formed articles 5 and 6 obtained in Comparative Examples 1 and 2. The formed articles 1 to 4 obtained in Examples 1 to 4 did not produce cracks when subjected to the bendability test. When subjecting the formed article 6 obtained in Comparative Example 2 to the bendability test, cracks occurred in the silicon nitride film.

The formed articles 1 to 4 obtained in Examples 1 to 4 exhibited excellent surface flatness as compared with the formed articles obtained in Comparative Examples 1 and 2.

It was thus confirmed that a formed article that exhibits an excellent gas barrier capability, excellent bendability, and excellent surface flatness can be obtained by implanting ions of a silicon compound into a polymer layer under appropriate conditions.

LIST OF REFERENCE SYMBOLS

1*a*, 1*c*: film-shaped formed body, 1*b*, 1*d*: film-shaped formed article, 2*a*, 2*b*: rotary can, 3*a*, 3*b*: feed-out roll, 4: plasma discharge electrode, 5*a*, 5*b*: wind-up roll, 6*a*, 6*b*: transfer roll, 7*a*, 7*b*: pulse power supply, 9*a*, 9*b*: high-voltage pulse, 10*a*, 10*b*: gas inlet, 11*a*, 11*b*: chamber

The invention claimed is:

1. An electronic device member comprising a formed article;
    wherein the formed article comprises an ion-implanted layer obtained by implanting ions of a silicon compound into a polymer layer;
    wherein the polymer layer is a polyorganosiloxane compound-containing layer;
    wherein the ion-implanted layer is obtained by implanting ions of the silicon compound into the polymer layer by plasma ion implantation method; and
    wherein the formed article has a water vapor transmission rate at a temperature of 40° C. and a relative humidity of 90% of less than 1g/m²/day.

2. An electronic device comprising the electronic device member according to claim 1.

\* \* \* \* \*